United States Patent [19]

Bowman et al.

[11] Patent Number: 5,044,943

[45] Date of Patent: Sep. 3, 1991

[54] SPOKED SUSCEPTOR SUPPORT FOR ENHANCED THERMAL UNIFORMITY OF SUSCEPTOR IN SEMICONDUCTOR WAFER PROCESSING APPARATUS

[75] Inventors: Russell Bowman; Roger N. Anderson, both of San Jose, Calif.

[73] Assignee: Applied Materials, Inc., Santa Clara, Calif.

[21] Appl. No.: 568,008

[22] Filed: Aug. 16, 1990

[51] Int. Cl.⁵ .................. F27D 5/00; B05C 13/00; B60L 1/02; F24J 3/00

[52] U.S. Cl. .................. 432/121; 432/227; 432/253; 432/231; 219/405; 118/500; 118/725

[58] Field of Search .............. 432/31, 227, 231, 232, 432/253, 121; 118/500, 725, 728, 729; 219/10.491, 10.67, 405, 411

[56] References Cited

U.S. PATENT DOCUMENTS

| | | | |
|---|---|---|---|
| 4,385,083 | 5/1983 | Shelley | 118/500 X |
| 4,433,246 | 2/1984 | Muka et al. | 219/405 X |
| 4,468,260 | 8/1984 | Hiramoto | 219/405 X |
| 4,504,730 | 3/1985 | Shimizu | 219/405 X |
| 4,514,250 | 4/1985 | Hwang | 118/725 X |
| 4,580,522 | 4/1986 | Fujioka et al. | 118/500 |
| 4,581,520 | 4/1986 | Vu et al. | 219/405 X |
| 4,625,678 | 12/1986 | Shioya et al. | 118/725 X |
| 4,654,509 | 3/1987 | Robinson et al. | 219/405 |
| 4,817,558 | 4/1989 | Itoh | 118/725 |
| 4,825,809 | 5/1989 | Mieno | 118/725 |
| 4,854,263 | 8/1989 | Chang et al. | 118/725 X |
| 4,897,171 | 1/1990 | Ohmi | 118/500 X |
| 4,958,061 | 9/1990 | Wakabayashi et al. | 118/725 X |

Primary Examiner—Henry A. Bennett
Assistant Examiner—Christopher B. Kilner
Attorney, Agent, or Firm—John P. Taylor

[57] ABSTRACT

An apparatus is described for processing semiconductor wafers for the construction of integrated circuit structures thereon wherein a semiconductor wafer is supported on the upper surface of a uniformly heated susceptor. The apparatus comprises a chamber, a circular susceptor in the chamber for supporting a semiconductor wafer thereon, heating means in the chamber beneath the susceptor, and support means for peripherally supporting the susceptor in the chamber comprising 3-6 spokes which are each connected at one end to a central hub which is coaxial with the axis of the circular susceptor, but spaced therefrom to permit even thermal distribution across the susceptor, and opposite ends of the spokes peripherally supporting the susceptor adjacent the end edges thereof, to permit uniform heating of the susceptor by the heating means and uniform thermal distribution of the heat through the susceptor.

14 Claims, 5 Drawing Sheets

SPOKED SUSCEPTOR SUPPORT FOR ENHANCED THERMAL UNIFORMITY OF SUSCEPTOR IN SEMICONDUCTOR WAFER PROCESSING APPARATUS

BACKGROUND OF THE INVENTION

1. Field of the Invention

This invention relates to an improved support for a susceptor on which is mounted a semiconductor wafer in apparatus used for the construction of integrated circuit structures on such wafers. More particularly, this invention relates to an improved support for a susceptor in a semiconductor wafer processing apparatus in which the outer edge of the susceptor is engaged by the support means, rather than the center of the susceptor, to provide more thermal uniformity across the susceptor, resulting in more even heating of the wafer.

2. Description of the Related Art

In the course of the forming of integrated circuit structures on semiconductor wafers, certain processes used involve the use of a heated susceptor or wafer support in an enclosed chamber, for example, during the growth of an epitaxial silicon layer, the formation of a thermal oxide or thermal nitride layer over silicon, or the rapid thermal annealing of integrated circuit structures already formed on the wafer.

As shown in the prior art structure of FIG. 1, a susceptor 2, on which is mounted a semiconductor wafer 16, is typically supported by a central support shaft 6 which may be either formed integrally with the susceptor or joined in some other manner to the center of the under surface of the susceptor, as seen in FIG. 1.

Typically, susceptor 2, and semiconductor wafer 16 mounted thereon, are located in a sealed processing chamber, such as the double domed chamber 10 shown in FIG. 1, where they are heated by a plurality of heating means 12 symmetrically arranged below susceptor 2 and chamber 10 in a housing 14, as well as over wafer 16 on susceptor 2 in chamber 10, as also shown in FIG. 1.

An apparatus showing, in more detail, such heating of the susceptor and the wafer is shown and claimed in Anderson et al. Ser. No. 07/491,416, filed Mar. 9, 1990 and assigned to the assignee of this invention, cross-reference to which is hereby made.

In that application, a series of heat lamps are circularly arranged below an inverted dome in which is mounted a susceptor on a central support shaft. Heat from the heat lamps radiates through the dome to the underside of the susceptor to heat the susceptor, as well as a wafer on the susceptor. The wafer is also heated by a second bank of heat lamps situated above another dome which is positioned over the wafer and susceptor.

The conventional use of a central support shaft in such an apparatus can result in uneven heat distribution along the susceptor, due to the thermal coupling of the central portion of the susceptor to the central support shaft, as well as the uneven distribution of the radiated heat from the heat source to the susceptor due to shadowing of the underside of the susceptor by the central support shaft. Such uneven heating, or thermal non-uniformity, of the susceptor can result in uneven heating of the wafer.

It would, therefore, be desirable to provide a support for a susceptor which would permit more even heating and thermal uniformity or heat distribution across the susceptor to provide more even heating of the semiconductor wafer being processed.

SUMMARY OF THE INVENTION

It is, therefore, an object of this invention to provide an improved apparatus for the processing of semiconductor wafers comprising means for peripherally supporting a susceptor in such apparatus to provide thermal uniformity in the susceptor resulting in more even heating of a semiconductor wafer placed thereon.

It is another object of this invention to provide an improved apparatus for the processing of semiconductor wafers comprising spoke means radiating from a central hub for peripherally supporting a circular susceptor spaced from said hub in such apparatus to provide thermal uniformity in the susceptor resulting in more even heating of a semiconductor wafer placed thereon.

These and other objects of the invention will be apparent from the following description and accompanying drawings.

DETAILED DESCRIPTION OF THE INVENTION

Figure 2:
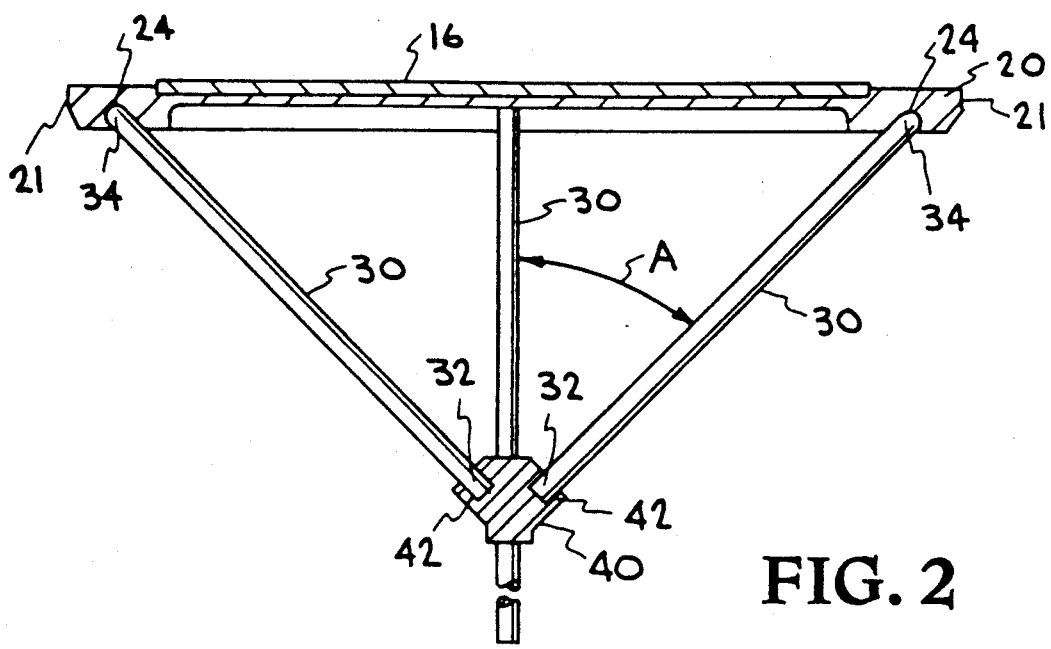
FIG. 2 is a vertical cross-sectional view of one embodiment of the invention showing three spokes radiating from a central hub and peripherally engaging the under-surface of the susceptor.

The invention provides an improved apparatus for the processing of semiconductor wafers using a heated circular susceptor in a processing chamber to heat a wafer thereon during the processing of the wafer wherein the circular susceptor is not supported by a central support shaft, as in the prior art. Rather, as shown in FIG. 2, a circular susceptor 20 is peripherally supported by peripheral support means comprising a series of spokes 30 which radiate out from a central support hub 40 which is coaxial with the axis of susceptor 20, but spaced from it, so as not to provide a thermal bridge between the center of the susceptor and the support hub which would result in uneven thermal distribution across the face of susceptor 20. Semiconductor wafer 16 mounted on susceptor 20 is, therefore, evenly heated across its entire area by susceptor 20 because of the uniform thermal distribution across susceptor 20 in accordance with the invention.

Susceptor 20 is usually constructed of graphite, to provide good thermal conductivity, and is provided with a silicon carbide coating, ranging in thickness from about 75 microns (3 mils) to about 175 microns (7 mils). The coating is provided to enhance the chemical stability of the susceptor to corrosive materials which may be present in the enclosed chamber. Spokes 30 and hub 40 may be constructed of similar materials to susceptor 20.

Figure 3A:
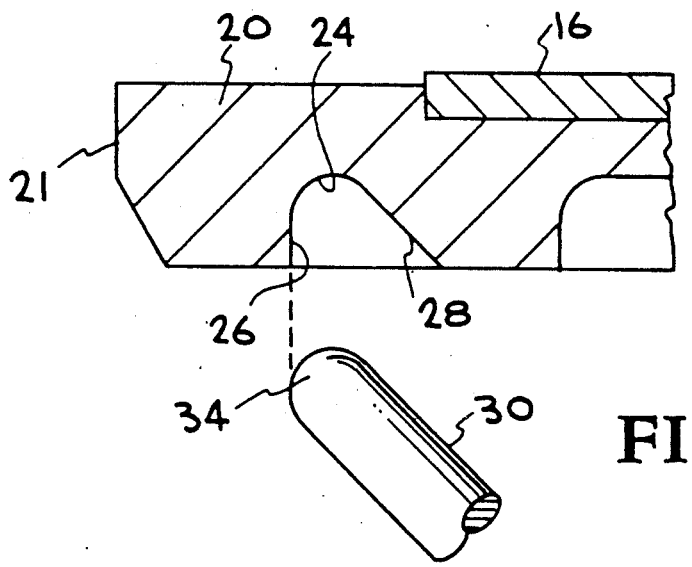
FIGS. 3A and 3B are fragmentary cross-sectional views of the embodiment of FIG. 2 showing an opening formed in the undersurface of the susceptor adjacent the end edge of the susceptor to receive the peripheral spoke support and showing, respectively, a support spoke to be received into the opening in FIG. 3A, and the support spoke inserted into the opening in FIG. 3B.
Figure 3B:
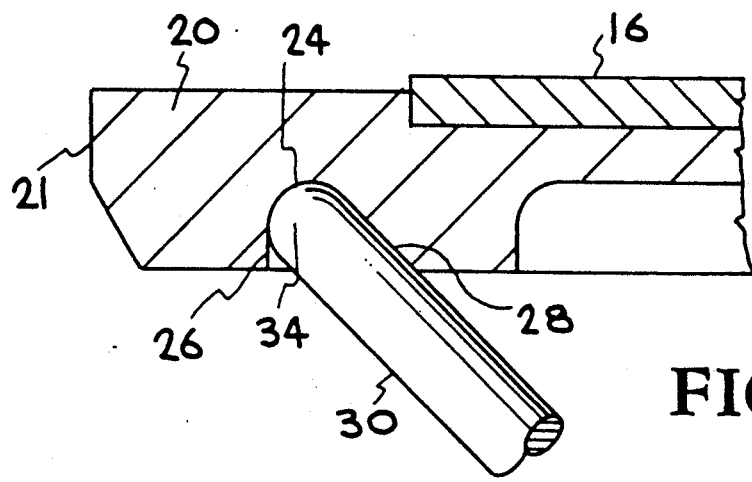
Figure 4:
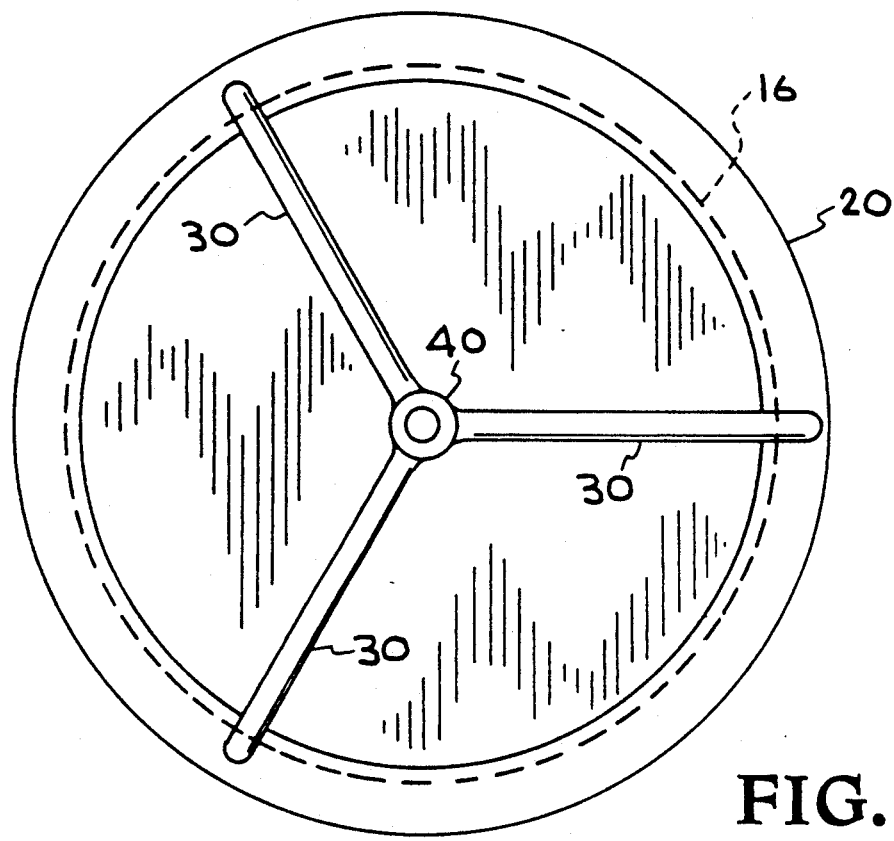
FIG. 4 is a bottom view of the embodiment of FIGS. 2 and 3.

Spokes 30, as shown in FIGS. 2 and 3, run from hub 40 to positions adjacent end edge 21 of susceptor 20 at an angle to the vertical, i.e., at an angle A to the vertical axis of hub 40 and susceptor 20. Angle A may range from about 45° to about 75°, and preferable from about 55° to 65° with a typical angle of 60°. This angle provides support for susceptor 20 at positions adjacent end edge 21 of susceptor 20, i.e., peripheral support of susceptor 20 rather than central support. In the embodiment shown in FIGS. 2, 3A–3B, and 4, the use of 3 supporting spokes is shown. However, it will be appreciated that additional spokes may be used, if desired, to provide additional support if this is believed to be necessary. Usually, the number of spokes will vary from about 3–6, with the use of additional spokes being possible, but not deemed to be necessary.

By use of the expression "positions adjacent the end edge of the susceptor", with respect to engagement of the susceptor by the support means, is meant that the point of engagement on the undersurface of the susceptor by the innermost portion of the support means is not more than about 30 millimeters from end edge 21 of the susceptor. Since the susceptor is usually larger in diameter than the wafer placed thereon, for example, by about 30 millimeters to about 80 millimeters (depending upon the wafer diameter), any thermal bridge from the susceptor to the hub via the spokes, created by the peripheral engagement of the susceptor by the support means, will not, therefore, result in any significant non-uniform thermal distribution of heat in those portions of the susceptor in contact with the wafer, unlike the centrally supported prior art susceptor.

In the embodiment shown in FIGS. 2, 3A, 3B, and 4, hub 40 is provided with angled bores 42 into which one end 32 of each spoke 30 is received. An opposite end 34 of each spoke is received in an opening 24 formed in the under surface of susceptor 20 adjacent the end edge of susceptor 20, i.e., the innermost part of opening 24 is within about 15 millimeters of end edge 21 of susceptor 20.

As best seen in FIGS. 3A and 3B, opening 24 in susceptor 20 has an outer edge 26 which is approximately vertical to the susceptor surface, i.e., parallel to end edge 21, and an inner edge 28 angled to match the angle which spoke 30 defines with the vertical axis of hub 40. This facilitates mounting of susceptor 20 on spokes 30 by a downward motion of susceptor 20 onto spokes 30, one of which is shown in FIGS. 3A and 3B to illustrate this point.

Figure 5:
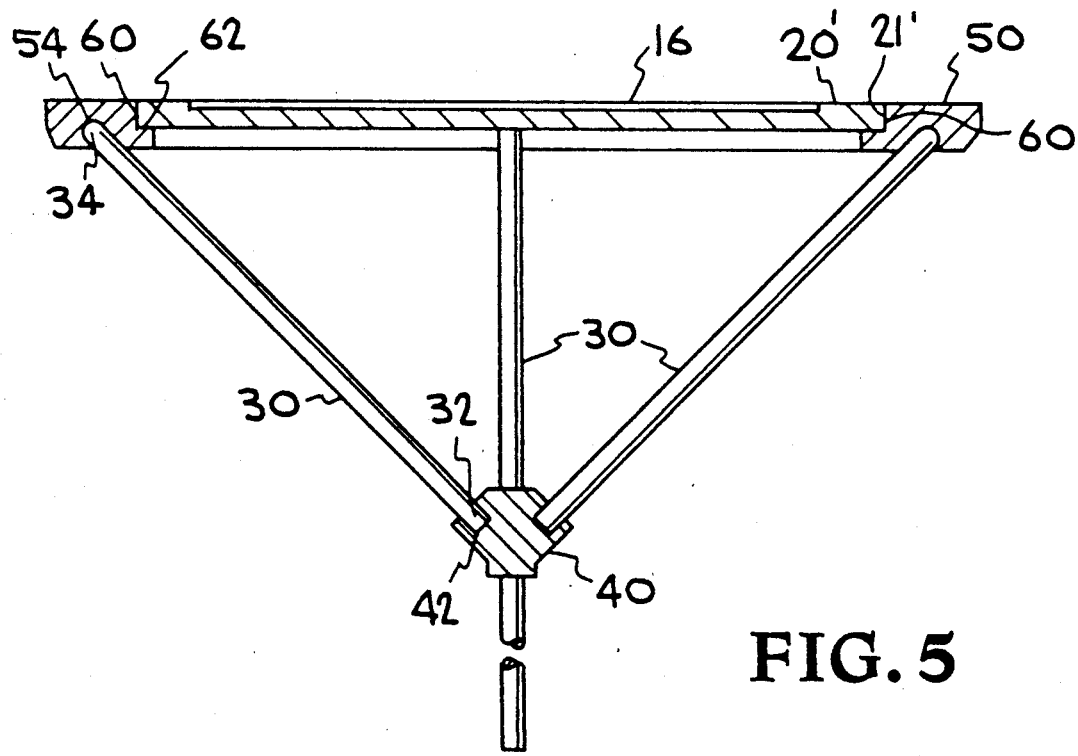
FIG. 5 is a vertical side section view of another embodiment of the invention wherein the susceptor is mounted on a ring which is peripherally supported by spokes from a central hub which spokes are received in openings in the underside of the ring.

Turning now to FIG. 5, another embodiment of the invention is shown wherein spokes 30 are again mounted at one end 32 into bores 42 of hub 40, but are received, at their opposite ends 34, into openings 54 of a support ring 50 which is provided with an inner bore 60 having an inner diameter slightly larger than the outer diameter of susceptor 20' and terminating in a shoulder 62 on which the undersurface of susceptor 20' rests adjacent the end edge 21' of susceptor 20', By "adjacent the end edge", in this context, is meant that the undersurface of susceptor 20' is not in contact with shoulder 62 for a distance greater than about 7 millimeter, typically about 2-3 millimeters, inwardly of end edge 21' of susceptor 20'. This serves to preserve the peripheral support concept of the invention wherein the peripheral support of the susceptor does not interfere with the uniform thermal distribution across the surface of the susceptor in contact with the wafer.

Openings 54 in support ring 50 may be shaped identical to openings 24 in susceptor 20 illustrated in FIG. 3A and 3B so that ring 50 may be mounted onto spokes 30 in an identical manner to the mounting of susceptor 20 onto spokes 30. Susceptor 20' may then be lowered vertically onto shoulder 62 of ring 50, and a wafer 16 mounted onto susceptor 20' in similar fashion to the mounting of wafer 16 in susceptor 20 in the previous embodiment. It will be noted that this embodiment also provides the peripheral support of the susceptor as in the previous embodiment, resulting in uniform thermal distribution across the susceptor, i.e., no central support connected or coupled to the susceptor which would provide a cold region in the center of the susceptor as in the prior art.

Figure 6:
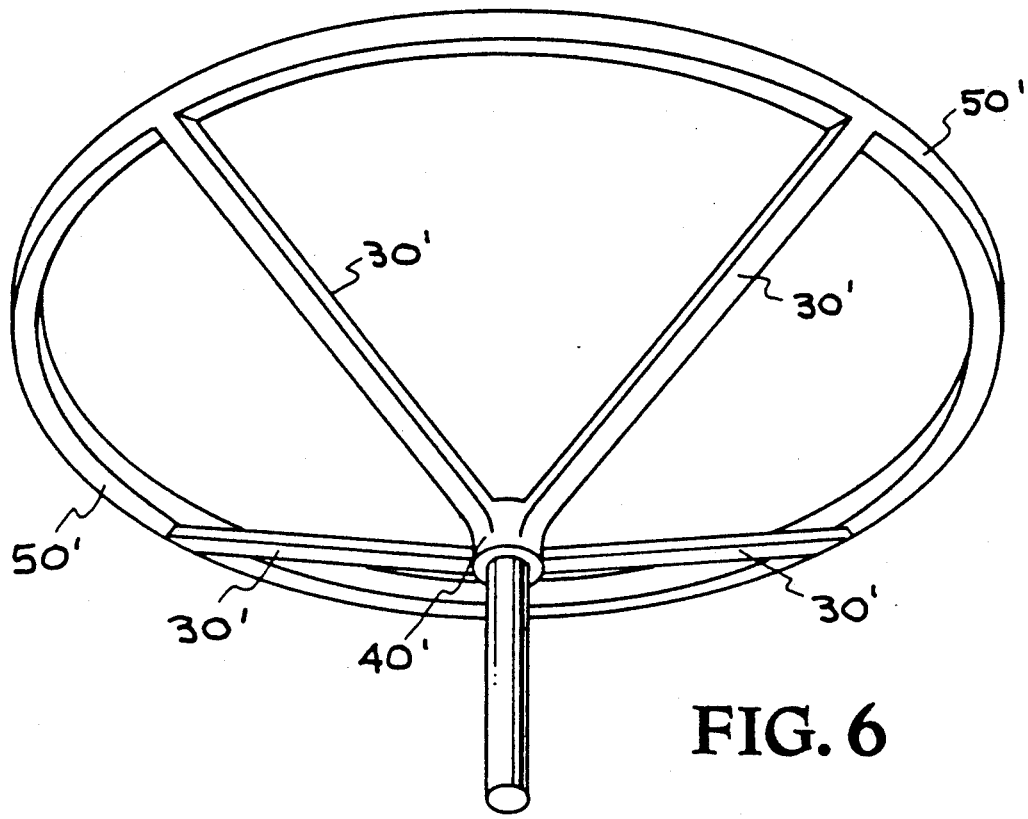
FIG. 6 is an isometric view of yet another embodiment of the invention showing a one piece construction of four spokes radiating from a central hub and attached to the undersurface of a ring which peripherally supports a susceptor.
Figure 7:
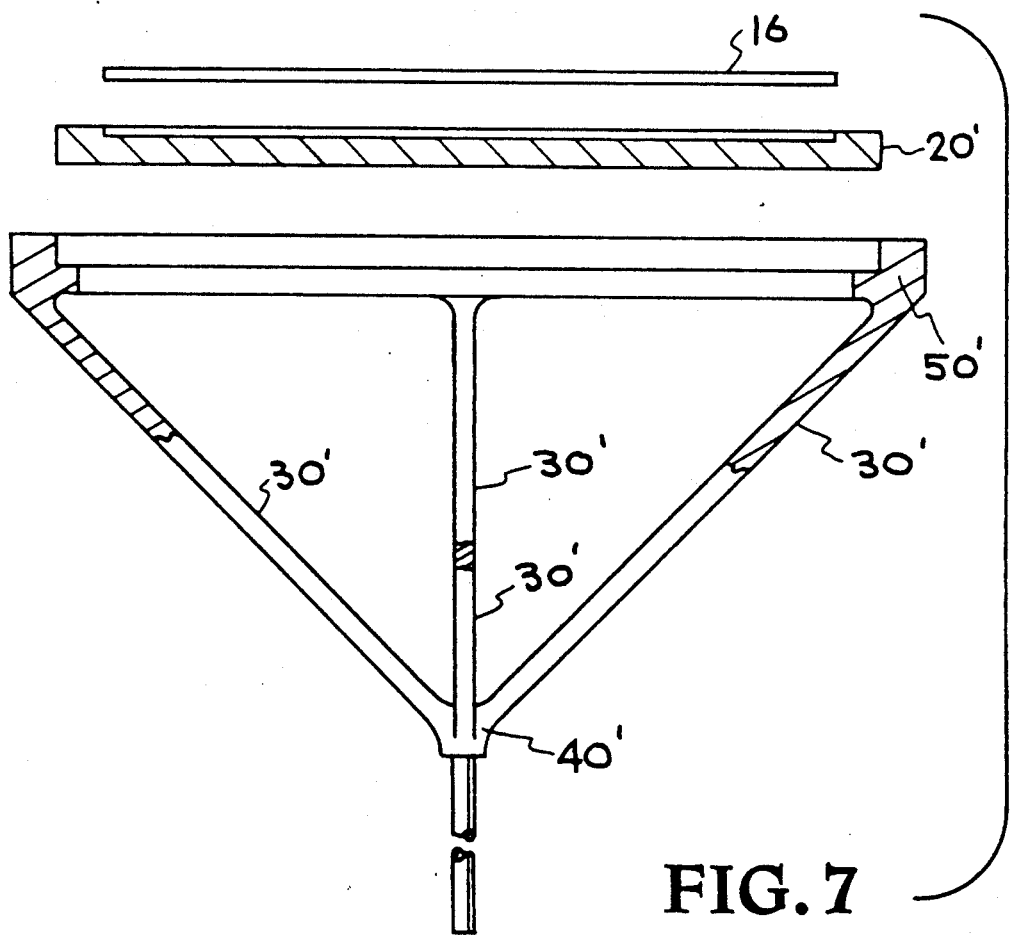
FIG. 7 is a vertical cross-sectional, and partially exploded, view of the embodiment of the invention shown in FIG. 6.

Turning now to FIGS. 6 and 7, in yet a third embodiment hub 40', spokes 30', and ring 50' may be formed of a single or unitary piece of silicon carbide-coated graphite, i.e., without bores 42 and spoke ends 32 fitted therein or ring openings 54 with spoke ends 34 received therein.

Such a design construction has the advantage that thermal expansion of the support means will be more uniform and have less tendency to cause warpage as the susceptor support structure expands and contracts.

Figure 8:
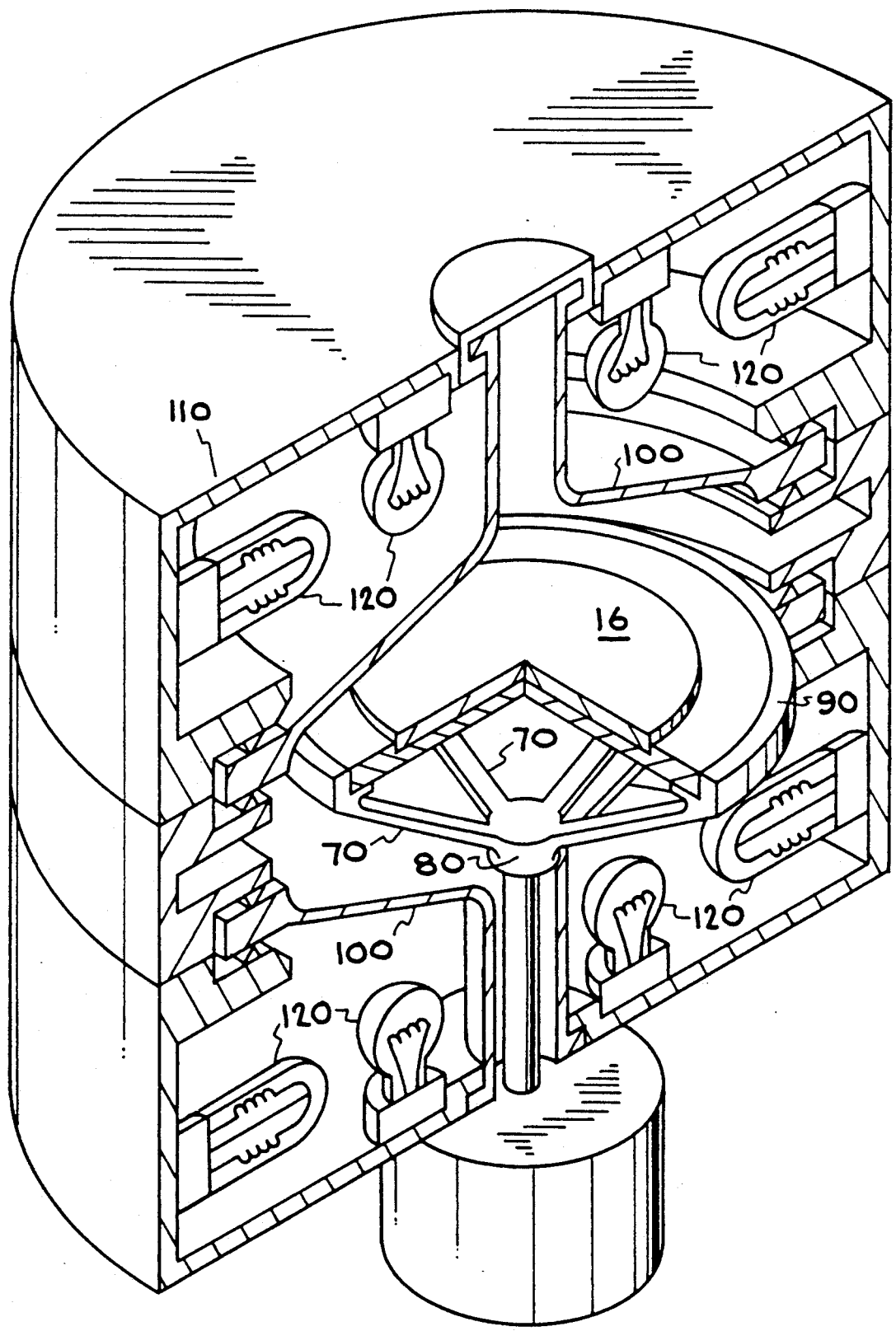
FIG. 8 is a partially cutaway isometric view showing the peripheral susceptor support of the invention mounted in a chamber in a housing containing heating means to heat the susceptor and the wafer carried on the susceptor.

FIG. 8 shows a peripherally supported susceptor 60 constructed in accordance with the invention, with a plurality of spokes 70 peripherally supporting susceptor 90, each of which spokes radiates out from a hub 80 which is spaced from the undersurface of susceptor 90. Susceptor 90 has a semiconductor wafer 16 mounted thereon and, together with spokes 70 and hub 80, is mounted in a containment vessel 100 located in a housing 110 which also contains a plurality of heating means 120 comprising heat lamps shown both above and below susceptor 90 to uniformly heat susceptor 90 and wafer 16 thereon.

Figure 1:
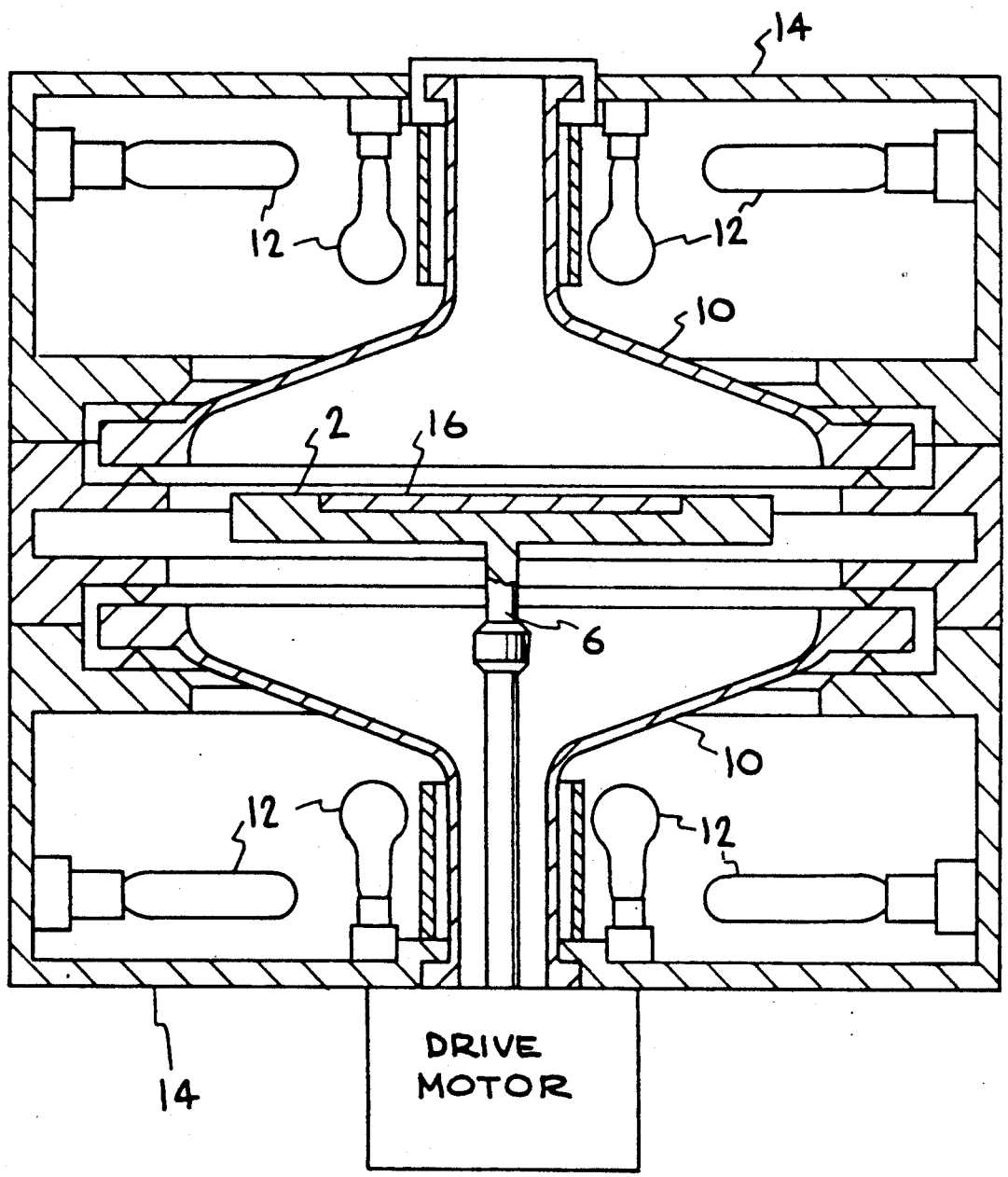
FIG. 1 is a vertical cross-sectional view of a prior art susceptor showing the central support shaft used to support the susceptor and conventional heating means used to heat the susceptor.

It will be readily apparent that, in contrast to the prior art structure of FIG. 1, susceptor 90 will be uniformly heated by heating means 120, resulting in a more uniform heating of wafer 16 mounted on susceptor 90.

Thus, the invention provides an improved apparatus for the processing of semiconductor wafers comprising a susceptor which is peripherally supported adjacent the end edges of the susceptor to provide more uniform thermal distribution across the susceptor of heat transferred to the susceptor by heating means and, therefore, a more uniform transfer of heat from the susceptor to a wafer mounted thereon. Furthermore, elimination of a central support shaft connected to the center of the undersurface of the susceptor also reduces shadowing of portions of the susceptor undersurface to provide more uniform heat transfer from the heating means to the susceptor.

Having thus described the invention what is claimed is:

1. In an apparatus for processing semiconductor wafers for the construction of integrated circuit structures thereon, wherein a semiconductor wafer is supported on the upper surface of a susceptor, heated by heating means in said apparatus the improvement comprising: support means for peripherally supporting said susceptor in said apparatus to provide thermal uniformity across said susceptor resulting in more even heating of a semiconductor wafer placed thereon, said support means comprising:
   (a) a central hub spaced from the center of said susceptor and positioned in said apparatus coaxial to said susceptor; and
   (b) a series of spokes radiating from said central hub and positioned between said susceptor and said heating means to engage an undersurface of said susceptor at positions adjacent the perimeter of said susceptor.

2. An apparatus for processing semiconductor wafers for the construction of integrated circuit structures thereon, wherein a semiconductor wafer is supported on the upper surface of a heated susceptor, which comprises:
   (a) a chamber;
   (b) a susceptor in said chamber for supporting a semiconductor wafer thereon;
   (c) heating means in said chamber beneath said susceptor; and
   (d) support means for peripherally supporting said susceptor in said chamber comprising:
      (i) a central hub spaced from and coaxial with said susceptor in said chamber; and
      (ii) a series of spokes positioned between said susceptor and said heating means which radiate from said central hub to support positions adjacent the perimeter of said susceptor;
   to permit uniform heating of said susceptor by said heating means and uniform thermal distribution of said heat through said susceptor.

3. The apparatus of claim 2 wherein said susceptor comprises a generally circular plate having a first surface on which is mounted said semiconductor wafer and an undersurface which is engaged by said peripheral support means.

4. The apparatus of claim 1 wherein said central hub is positioned coaxial with said susceptor and spaced from the center of said susceptor.

5. The apparatus of claim 4 wherein said central hub is spaced from said susceptor a sufficient distance, with respect to the diameter of said susceptor, to permit said spokes to define an angle of from about 45° to about 75° with an axis passing through said hub and said susceptor.

6. The apparatus of claim 4 wherein said central hub is spaced from said susceptor a sufficient distance, with respect to the diameter of said susceptor, to permit said spokes to define an angle of from about 55° to about 65° with an axis passing through said hub and said susceptor.

7. The apparatus of claim 5 wherein said series of spokes peripherally supporting said susceptor comprise at least 3 spokes.

8. The apparatus of claim 5 wherein said series of spokes peripherally supporting said susceptor comprise from 3 to 6 spokes.

9. The apparatus of claim 7 wherein one end of each of said spokes is received in an opening formed in an undersurface of said susceptor at a position adjacent said perimeter of said susceptor.

10. The apparatus of claim 2 wherein said peripheral support means further comprise a support ring engaged by said spokes.

11. The apparatus of claim 7 wherein one end of each of said spokes is received in an opening formed in an undersurface of a ring which peripherally engages and supports said susceptor adjacent said perimeter of said susceptor.

12. An apparatus for processing semiconductor wafers for construction of integrated circuit structures thereon, wherein a semiconductor wafer is supported on the upper surface of a heated susceptor, which comprises:
   (a) a chamber;
   (b) a circular susceptor in said chamber for supporting a semiconductor wafer thereon;
   (c) heating means in said chamber beneath said susceptor; and
   (d) support means for peripherally supporting said susceptor in said chamber comprising 3-6 spokes positioned between said susceptor and said heating means which are each connected at one end to a central hub which is coaxial with the axis of said circular susceptor, but spaced therefrom to permit even thermal distribution across said susceptor, and opposite ends of said spokes peripherally supporting said susceptor adjacent the end edges thereof;
   to permit uniform heating of said susceptor by said heating means and uniform thermal distribution of said heat through said susceptor.

13. The apparatus of claim 12 wherein said support means comprise:
   a) a peripheral support ring on which said wafer rests;
   b) said spokes which engage said peripheral support ring; and
   c) said central hub.

14. An apparatus for processing semiconductor wafers for the construction of integrated circuit structures thereon, wherein a semiconductor wafer is supported on the upper surface of a heated susceptor, which comprises:
   (a) a chamber;
   (b) a susceptor in said chamber for supporting a semiconductor wafer thereon comprising a generally circular support plate having a first surface, on which is mounted said semiconductor waver, and an undersurface;
   (c) heating means in said chamber beneath said susceptor; and
   (d) support means for peripherally supporting said susceptor in said chamber by engaging said undersurface of said susceptor, said support means comprising;
      (i) a circular support ring having an inner shoulder thereon on which said susceptor is mounted; and
      (ii) a series of spokes, positioned between said susceptor and said heating means, which radiate from a central hub to engage said circular support ring at positions adjacent the perimeter of said circular support ring;
   to permit uniform heating of said susceptor by said heating means and uniform thermal distribution of said heat through said susceptor.

* * * * *